(12) United States Patent
Lee et al.

(10) Patent No.: US 6,540,935 B2
(45) Date of Patent: Apr. 1, 2003

(54) CHEMICAL/MECHANICAL POLISHING SLURRY, AND CHEMICAL MECHANICAL POLISHING PROCESS AND SHALLOW TRENCH ISOLATION PROCESS EMPLOYING THE SAME

(75) Inventors: Jong-won Lee, Sungnam (KR); Jae-dong Lee, Seoul (KR); Bo-an Yoon, Seoul (KR); Sang-rok Hah, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 92 days.

(21) Appl. No.: 09/826,169

(22) Filed: Apr. 5, 2001

(65) Prior Publication Data
US 2003/0022499 A1 Jan. 30, 2003

(51) Int. Cl.[7] .............................................. C09K 13/00
(52) U.S. Cl. ..................... 252/79.1; 252/79.2; 252/79.3; 252/79.4
(58) Field of Search .............................. 252/79.1, 79.2, 252/79.3, 79.4

(56) References Cited

U.S. PATENT DOCUMENTS

| | | | |
|---|---|---|---|
| 5,476,606 A | | 12/1995 | Brancaleoni et al. |
| 5,738,800 A | | 4/1998 | Hosali et al. |
| 5,759,917 A | | 6/1998 | Grover et al. |
| 5,958,794 A | | 9/1999 | Bruxvoort et al. |
| 6,042,741 A | * | 3/2000 | Hasali et al. ............... 252/79.1 |
| 6,316,365 B1 | * | 11/2000 | Wang et al. ................. 438/692 |
| 6,217,416 B1 | * | 4/2001 | Kaufman et al. ............. 451/41 |
| 6,238,592 B1 | * | 5/2001 | Hardy et al. ................ 252/79.1 |

* cited by examiner

Primary Examiner—George Goudreau
(74) Attorney, Agent, or Firm—Volentine Francos, PLLC

(57) ABSTRACT

A CMP oxide slurry includes an aqueous solution containing abrasive particles and two or more different passivation agents. Preferably, the aqueous solution is made up of deionized water, and the abrasive particles are a metal oxide selected from the group consisting of ceria, silica, alumina, titania, zirconia and germania. Also, a first passivation agent may be an anionic, cationic or nonionic surfactant, and a second passivation agent may be a phthalic acid and its salts. In one example, the first passivation agent is poly-vinyl sulfonic acid, and the second passivation agent is potassium hydrogen phthalate. The slurry exhibits a high oxide to silicon nitride removal selectivity.

25 Claims, 6 Drawing Sheets

CHEMICAL/MECHANICAL POLISHING SLURRY, AND CHEMICAL MECHANICAL POLISHING PROCESS AND SHALLOW TRENCH ISOLATION PROCESS EMPLOYING THE SAME

BACKGROUND OF THE INVENTION

1. Field of the Invention

The present invention relates to chemical/mechanical polishing (CMP) of microelectronic devices, and more particularly, the present invention relates to CMP slurries and to fabrication processes employing CMP slurries.

2. Description of the Related Art

As the degree of integration of microelectronic devices continues to increase, planarization processes used in the fabrication of such devices become more and more critical. That is, efforts to achieve highly integrated semiconductor devices are typically attended by the stacking of multiple interconnection and other layers on a semiconductor wafer. The resultant unevenness of the wafer surface presents a variety of problems which are well-documented in the art. Planarization processes are thus adopted at various stages of fabrication in an effort to minimize irregularities in the wafer surface.

One such planarization technique is chemical/mechanical polishing (CMP). In CMP, the wafer surface is pressed against a polishing pad in relative rotation. During polishing, an abrasive and chemically reactive solution known as a CMP slurry is made to flow into the polishing pad. This CMP technique planarizes the wafer surface by means of chemical and physical reactions, that is, by supplying the chemically reactive slurry on a patterned surface of the wafer while at the same time physically pressing the relative rotating surface of the polishing pad against the surface of the wafer.

Figure 1:
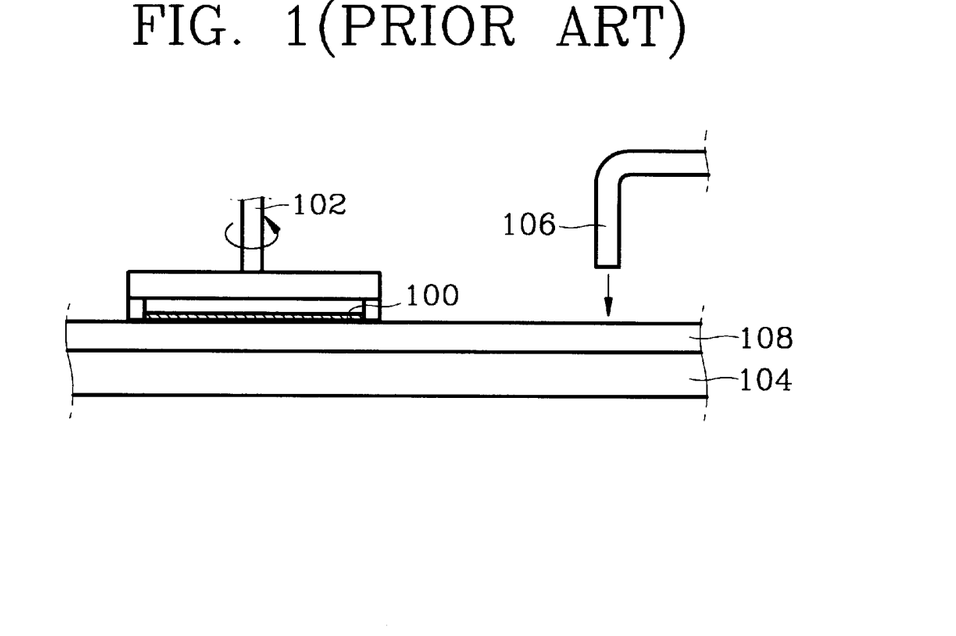
FIG. 1 is a schematic diagram of a conventional chemical/mechanical polishing (CMP) apparatus.

FIG. 1 is a schematic diagram showing a conventional example of a CMP apparatus used in the manufacture semiconductor devices. The illustrated CMP apparatus includes a polishing head 102, a polishing table 104, a slurry supply line 106 and a polishing pad 108. The CMP process is carried out on the polishing table 104, having the polishing pad 108 formed thereon. That is, while a slurry is supplied from a slurry supply line 106, the polishing head 102 is made to rotate while pressing the substrate 100 against the polishing pad 108. In this manner, polishing is achieved.

Figure 2A:
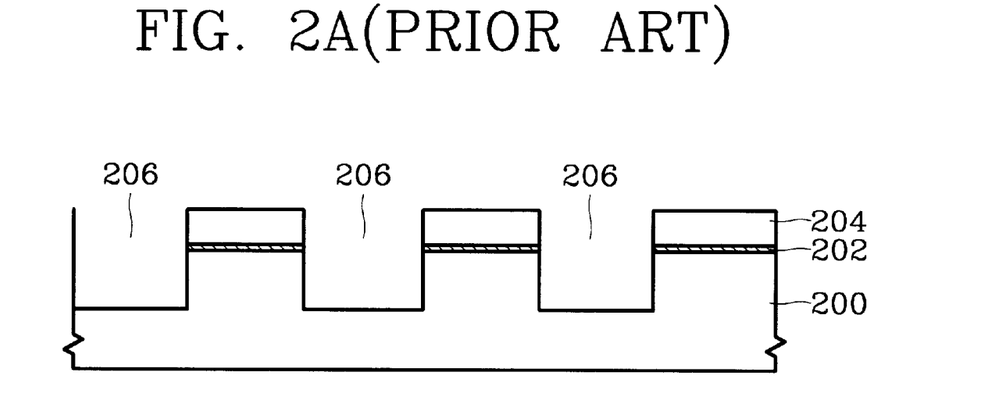
FIGS. 2(a) through 2(d) illustrate stages of a conventional shallow trench isolation (STI) process.
Figure 2B:
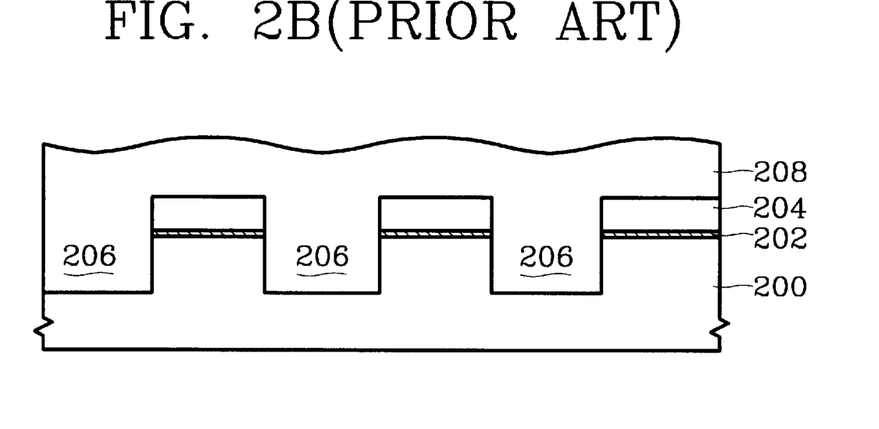
Figure 2C:
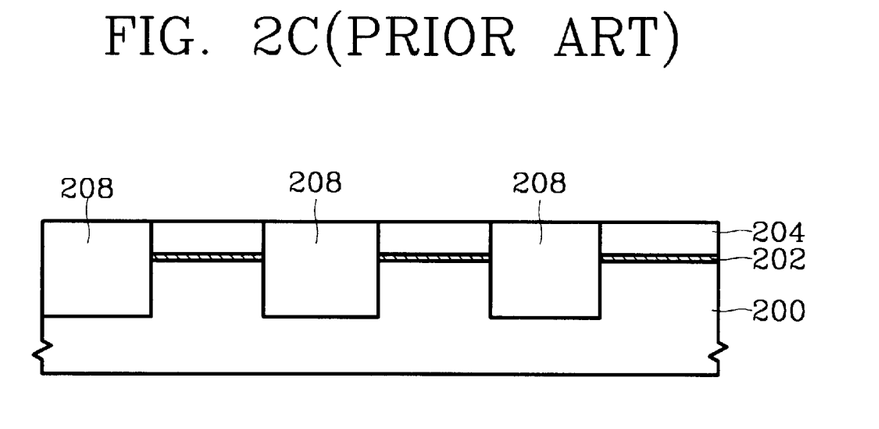
Figure 2D:
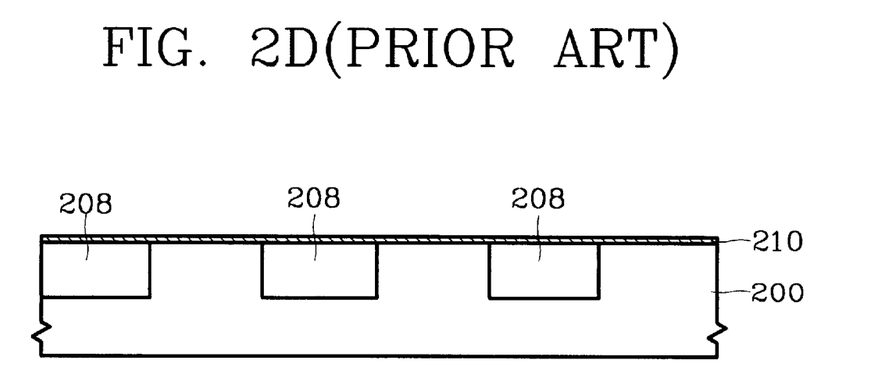

One common application of CMP is in shallow trench isolation (STI). In STI techniques, relatively shallow isolation trenches are formed, which function as field regions used to separate active regions on a wafer. A conventional example of an STI process is shown in FIGS. 2(a)–2(d). In this process, a pad oxide layer 202 and a silicon nitride (SiN) stop layer 204 are sequentially stacked on a semiconductor substrate 200. Thereafter, a photoresist pattern (not shown) is formed atop the SiN stop layer 204. Then, using the photoresist as a mask, the SiN stop layer 204, pad oxide layer 202 and the semiconductor substrate 200 are partially etched to form a plurality of trenches 206 as shown in FIG. 2(a). Subsequently, as shown in FIG. 2(b), an insulating oxide layer 208 (which will ultimately form the trench oxide regions) is deposited so as to fill the trenches 206 and cover the surface of the SiN stop layer 204. The oxide layer 208 is then subjected to CMP so as to remove the oxide layer 208 down to the level of the SiN stop layer 204. As a result, the configuration of FIG. 2(c) is obtained. The SiN stop layer 204 and the pad oxide layer 202 on the active regions are then removed via an etching process. Thereafter, a gate oxide layer 210 is formed on the surface of the semiconductor substrate 200 as shown in FIG. 2(d).

During the first-mentioned CMP process, the oxide layer 208 is removed until the upper surface of the SiN stop layer 204 is exposed. Due to differing chemical and physical characteristics thereof, the oxide and SiN layers exhibit different removal rates when subjected to CMP using known slurries. The ratio of these removal rates at least partially defines the "selectivity" of the slurry being used. The lower the selectivity of the slurry, the more SiN that will be polished away during the CMP process.

Ideally, the CMP process would not remove any of the SiN layer, i.e., the selectivity would be infinite. However, present CMP slurries exhibit low selectivity (about 4 to 1, oxide to SiN), and thus polish the SiN layer at unacceptably high rates. As a result, the SiN patterns may be irregularly removed during the CMP process, whereby thicknesses of the SiN patterns may vary across the wafer. This is especially problematic in the case where the semiconductor substrate has both densely and sparsely distributed patterns on the surface thereof. The end result is step differences between the active and field regions when the formation of the field regions is complete. This can adversely affect subsequent device fabrication, which in turn can degrade transistor and device characteristics, thus reducing process margins.

Hence, in the STI process, it is desirable that the SiN layer patterns have uniform thicknesses after removal of the oxide layer by CMP. However, uniformly thick SiN patterns are extremely difficult to achieve since present CMP slurries do not exhibit sufficient selectivity between the oxide and SiN layers.

SUMMARY OF THE INVENTION

It is an object of the present invention to provide a CMP slurry which exhibits improved removal selectivity between oxide and silicon nitride layers.

It is a further object of the present invention to provide a CMP process which exhibits improved removal selectivity between oxide and silicon nitride layers.

It is still a further object of the present invention to provide an STI process which utilizes a CMP process having high removal selectivity between oxide and silicon nitride layers.

According to one aspect of the invention, a CMP slurry is provided which includes an aqueous solution containing abrasive particles and two or more different passivation agents. Preferably, the aqueous solution is made up of deionized water, and the abrasive particles are a metal oxide selected from the group consisting of ceria, silica, alumina, titania, zirconia and germania. Also, a first passivation agent may be an anionic, cationic or nonionic surfactant, and a second passivation agent may be a phthalic acid. In one example, the first passivation agent is poly-vinyl sulfonic acid, and the second passivation agent is potassium hydrogen phthalate.

The aqueous solution forming the CMP slurry may also include a removal rate accelerator, such as ammonium hydrogen phosphate. The aqueous solution may further include a pH controller for controlling a pH thereof.

In another aspect of the invention, a CMP method is provided in which a surface of a semiconductor wafer is made to contact a surface of a polishing pad, an aqueous solution containing abrasive particles and different first and second passivation agents is supplied to an interface between the surface of the polishing pad and the surface of the semiconductor wafer, and the surface of the semiconductor wafer is made to rotate relative to the surface of the polishing pad.

In still another aspect of the present invention, an STI method is provided in which a pad oxide layer and a silicon nitride layer are sequentially formed over a surface of a semiconductor substrate, a plurality of trenches are formed through the silicon nitride layer and the pad oxide layer and into the semiconductor substrate, an insulating oxide layer is formed within the plurality of trenches and over the silicon nitride layer, the insulating oxide layer is subjected to CMP so as to remove the insulating oxide layer down to a level of silicon nitride layer, and the pad oxide layer and the silicon nitride layer are then removed. In this STI method, the CMP includes contacting a surface of the insulating oxide layer with a surface of a polishing pad, supplying an aqueous solution containing abrasive particles and different first and second passivation agents to an interface between the surface of the polishing pad and the surface of the insulating oxide layer, and rotating the surface of the semiconductor wafer relative to the surface of the polishing pad.

BRIEF DESCRIPTION OF THE DRAWINGS

The above and other objects, features and advantages of the invention will become readily apparent from the detailed description that follows, with reference to the accompanying drawings, in which.

DETAILED DESCRIPTION OF THE PREFERRED EMBODIMENT(S)

The chemical/mechanical polishing (CMP) slurry of the present invention is an aqueous solution containing, for example, deionized water. As discussed in detail herein, the present invention is at least partially characterized by the discovery that the inclusion of two or more different passivation agents, together with the abrasive particles of the CMP slurry, results in an unexpectedly high oxide to silicon nitride (SiN) selectivity.

Preferably, a first passivation agent is an anionic, cationic or nonionic surfactant, and a second passivation agent is a phthalic acid. During the CMP process, the first and second passivation agents result in selective passivation of the SiN stop layer only, thus reducing etching of the SiN stop layer (which in turn increases selectivity). With respect to the first passivation agent, the anionic surfactant may be selected from the group consisting of a carboxylic acid or its salt, a sulfuric ester or its salt, a sulfonic acid or its salt, and a phosphoric ester or its salt, the cationic surfactant may be selected from the group consisting of a primary amine or its salt, a secondary amine or its salt, a tertiary amine or its salt, and a quaternary amine or its salt, and the nonionic surfactant may be selected from the group consisting of a polyethyleneglycol type surfactant and a polyhydroxy alcohol type surfactant. In one example, the first passivation agent is poly-vinyl sulfonic acid, and the second passivation agent is potassium hydrogen phthalate.

A weight percentage of the first passivation agent in the aqueous solution may be 0.001–10 wt %, and preferably 0.01–5 wt %. A weight percentage of the second passivation agent in the aqueous solution may be 0.001–1 wt %, and preferably 0.020–0.5 wt %.

Also, the aqueous solution forming the CMP slurry preferably includes a removal rate accelerator. The removal rate accelerator may be one selected from the group consisting of ammonium dihydrogen phosphate, potassium dihydrogen phosphate, bis(2-ethylhexyl)phosphate, 2-aminoethyl dihydrogenphosphate, 4-chlorobenzenediazonium hexafluorophosphate, nitrobenzenediazonium hexafluorophosphate, ammonium hexafluorophosphate, bis (2,4 dichlorophenyl)chlorophosphate, bis(2-ethylhesyl) hydrogenphosphate, bis(2-ethylhexyl)phosphite, calcium fluorophosphate, diethyl chlorophosphate, diethyl chlorothiophosphate, potassium hexafluorophosphate, pyrophosphoric acid, tetrabutylammonium hexafluorophosphate, and tetraethylammonium hexafluorophosphate. In one example, the removal rate accelerator is ammonium hydrogen phosphate, and a weight percentage of the ammonium hydrogen phosphate in the aqueous solution may be 0.001–10 wt %, and preferably 0.01–1 wt %.

The aqueous solution forming the CMP slurry further preferably includes a pH controller. For example, a pH of the aqueous solution may be between 2 and 6 inclusive. The aqueous solution may be an acid solution such as sulfuric acid, chloric acid, phosphoric acid, nitric acid, or the like, or the aqueous solution may be an alkaline solution such as potassium hydroxide, sodium hydroxide, ammonium hydroxide, or the like.

The abrasive particles of the CMP slurry are preferably a metal oxide selected from the group consisting of ceria, silica, alumina, titania, zirconia and germania. In one example, the abrasive particles are cerium oxide and a weight percentage of the abrasive particles in the aqueous solution is 0.1–25 wt %.

As will be shown below, the CMP slurry of the present invention can provide an oxide to silicon nitride selectivity of 50:1 and higher.

Figure 3:
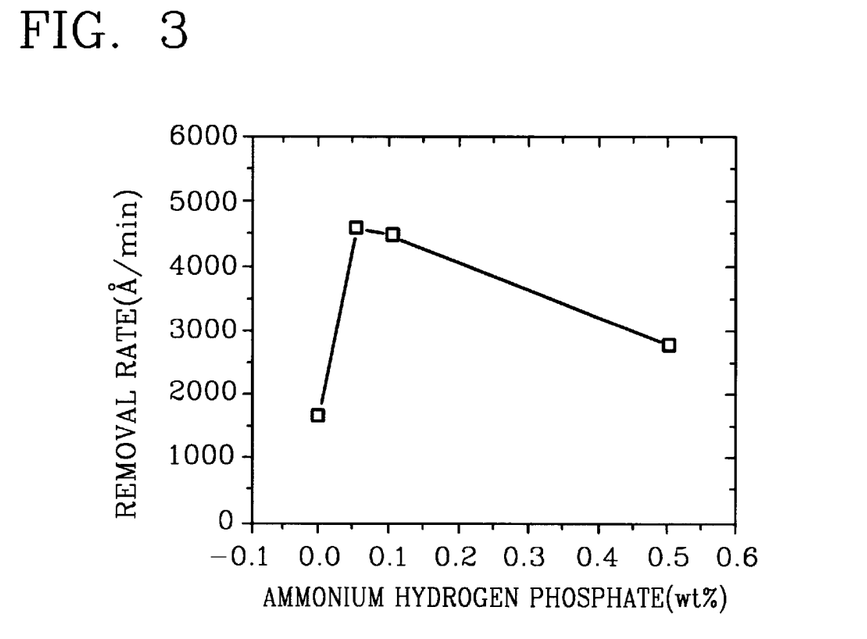
FIG. 3 shows the variation in the rate of oxide removal with respect to the weight percentage of a removal rate accelerator added to an oxide slurry.

First, however, reference is made to FIG. 3 which illustrates the effects of a removal rate accelerator, such as ammonium hydrogen phosphate. In particular, this figure shows the variation in the rate (in Å/min) of oxide removal with respect to the weight percentage amount of ammonium hydrogen phosphate added to the oxide slurry. In this example, the abrasive contained in the slurry is cerium oxide. As can be seen from FIG. 3, the CMP removal rate of the oxide increases substantially upon the addition of ammonium hydrogen phosphate to the oxide slurry.

Figure 4:
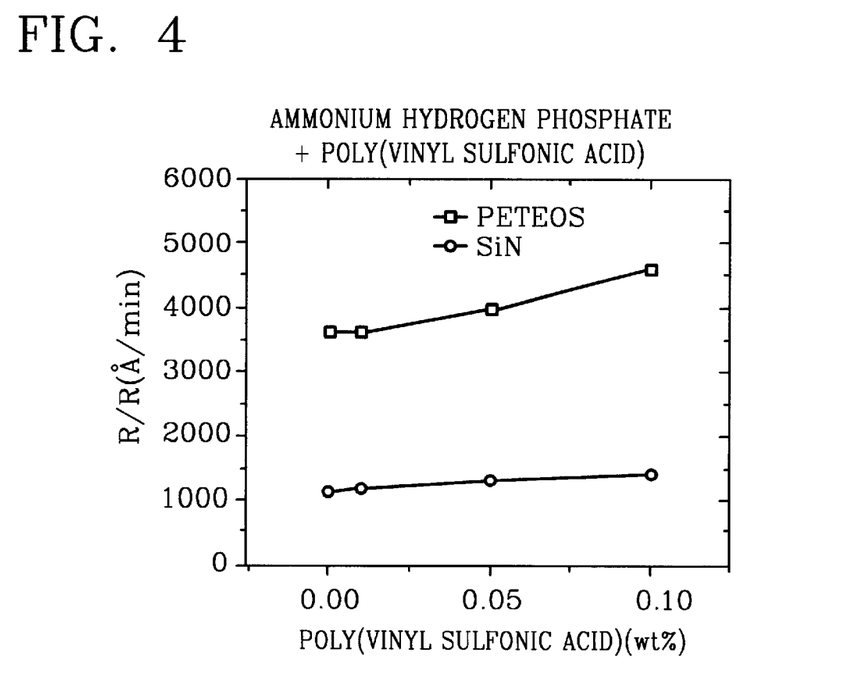
FIG. 4 shows a variation in both the oxide removal rate and the silicon nitride (SIN) removal rate as a function of a weight percentage of a first passivation agent.

Turning now to FIG. 4, the effect of combining a single passivation agent with a removal rate accelerator is shown. In particular, this figure shows a variation in both the oxide (PETEOS) removal rate and the silicon nitride (SiN) removal rate as a is function of a weight percentage of poly-vinyl sulfonic acid, which is an anionic surfactant, that is added as a single passivation agent to the oxide slurry. In this example, the oxide slurry also includes the ammonium hydrogen phosphate (removal rate accelerator) discussed above in connection with FIG. 3. As can be seen from FIG. 4, the oxide removal rate increases somewhat relative to that of FIG. 3. However, the oxide to SiN selectivity of the slurry is disadvantageously low.

Figure 5:
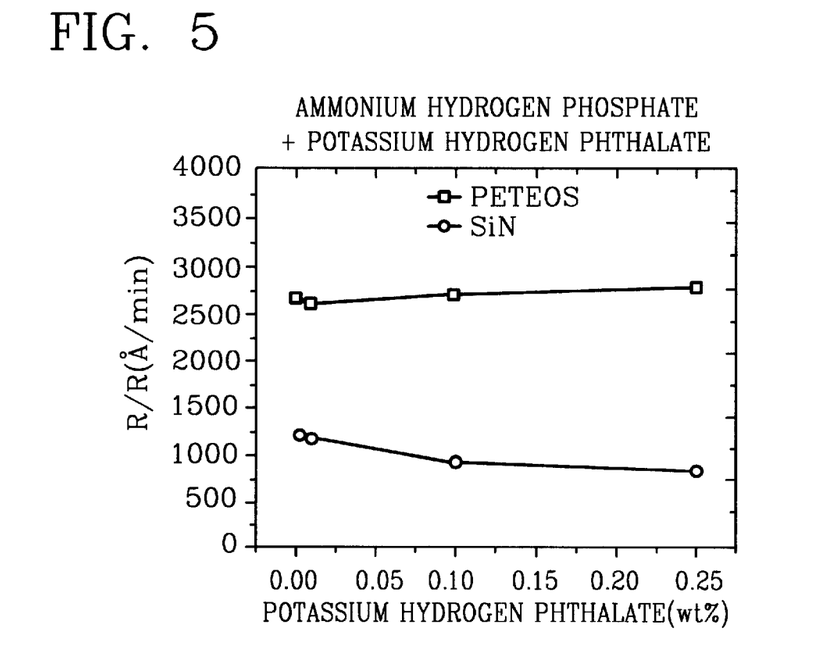
FIG. 5 shows a variation in both the oxide removal rate and the silicon nitride (SIN) removal rate as a function of a weight percentage of a second passivation agent.

Referring next to FIG. 5, the effect of combining a different single passivation agent with a removal rate accelerator is shown. In particular, this figure shows a variation in both the oxide (PETEOS) removal rate and the silicon nitride (SiN) removal rate as a function of a weight percentage of potassium hydrogen phthalate, which is added as a single passivation agent to the oxide slurry. In this example, the oxide slurry also includes the ammonium hydrogen phosphate (removal rate accelerator) discussed above in connection with FIG. 3. As can be seen from FIG. 5, there are insubstantial changes in the oxide removal rate, and the silicon nitride removal rates decreases somewhat. Further, the oxide to SiN selectivity remains low.

Thus, as can be seen from FIGS. 4 and 5, the addition of a single passivation agent (either poly-vinyl sulfonic acid or potassium hydrogen phthalate) to the CMP slurry does not result a relatively high oxide to SiN selectivity.

Figure 6:
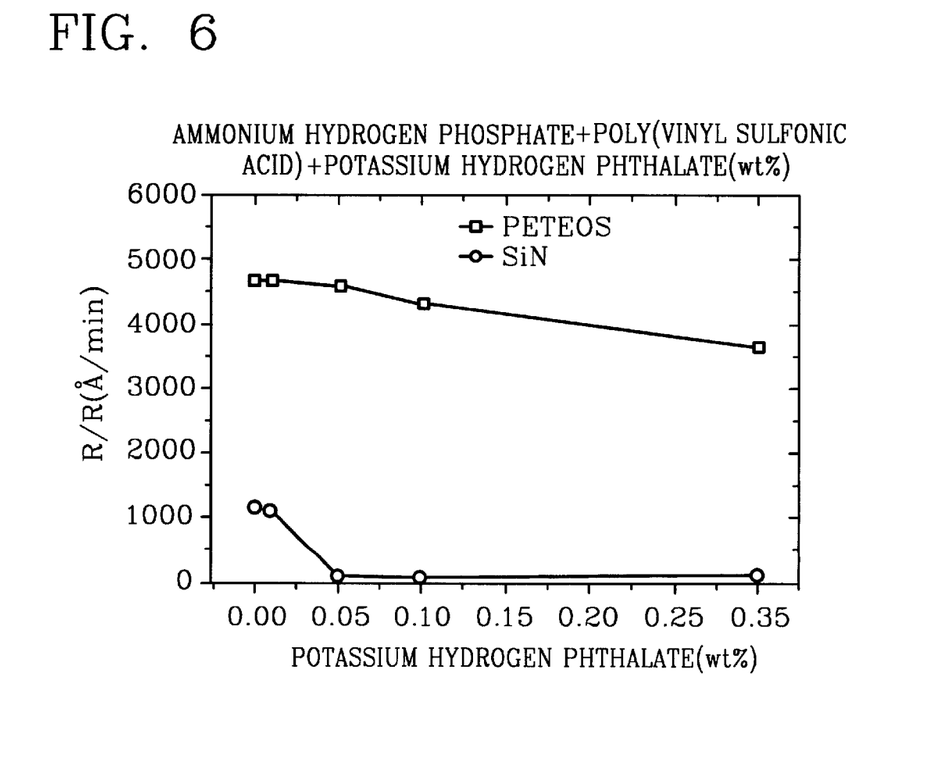
FIG. 6 shows a variation in both the oxide removal rate and the silicon nitride (SiN) removal rate as a function of a weight percentage of the second passivation agent in combination with a fixed amount of the first passivation agent.

As stated previously, the present invention is at least partially characterized by the discovery that the inclusion of two or more different passivation agents together with the abrasive particles of the CMP slurry results in an unexpectedly high oxide to silicon nitride (SiN) selectivity. This is demonstrated by way of example in FIG. 6. In particular, like FIG. 5, this figure shows a variation in both the oxide (PETEOS) removal rate and the silicon nitride (SiN) removal rate as a function of a weight percentage of potassium hydrogen phthalate, which is added as a passivation agent to the oxide slurry. Unlike the example of FIG. 5, however, the oxide slurry of FIG. 6 also includes an additional passivation agent (poly-vinyl sulfonic acid), as well as the ammonium hydrogen phosphate (removal rate accelerator). That is, the slurry of the example of FIG. 6 includes two different passivation agents (a first passivation agent of poly-vinyl sulfonic acid and a second passivation agent of potassium hydrogen phthalate), as well as a removal rate accelerator. Here, the percentage amount of the poly-vinyl sulfonic acid is 0.05 wt %. As is readily apparent from the large disparities in oxide and SiN removal rates shown in FIG. 6, a surprisingly high oxide to SiN CMP selectivity can be achieved by adding two different passivation agents (e.g., poly-vinyl sulfonic acid and potassium hydrogen phthalate) to the CMP slurry.

As mentioned previously, the CMP slurry of the present invention preferably includes a pH controller. The pH controller can control the pH of the slurry by varying the composition of an acid solution such as sulfuric acid, phosphoric acid, hydrochloric acid, nitric acid or carboxylic acid, or an alkaline solution such as ammonium hydroxide or potassium hydroxide, depending on the weight percentages of the removal rate accelerator and the first and second passivation agents that have been added to the slurry. In this embodiment, the pH of slurry is controlled using sulfuric acid and potassium hydroxide.

Figure 7:
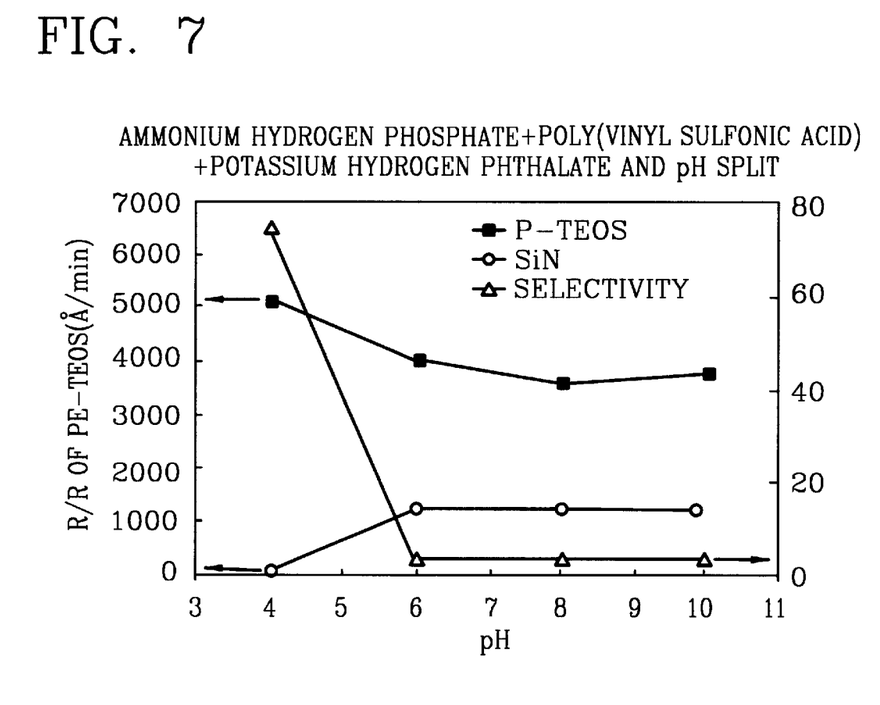
FIG. 7 shows a variation in both the oxide removal rate, the silicon nitride (SiN) removal rate and oxide to SiN selectivity as a function pH.

FIG. 7 shows the oxide and silicon nitride removal rates of a CMP slurry as a function of pH. Here, the slurry includes the removal rate accelerator and the first and second passivation agents, and the pH of the resultant slurry was arbitrarily controlled using the pH controller. As can be seen from FIG. 7, the highest oxide to SiN selectivity is exhibited at pH 4.

To further enhance understanding of the present invention, a number of different test examples are described below.

<First Test Samples>

Three slurry samples were fabricated to estimate variations in the characteristics of the slurry with respect to an amount of phosphate compound added to the slurry. In a sample wafer, which was a PETEOS blanket wafer, PETEOS was deposited to a thickness of 10000 Å on a polysilicon substrate, and a ceria polishing solution of 1 wt % was used as a polishing agent. Polishing was performed in 6' PRESI equipment using an IC1400 stack pad and an R200 carrier film from the RODEL company, at a down pressure of 5 psi, a table speed of 65 rpm, a spindle speed of 35 rpm and a slurry flow rate of 250 ml/min. The results of estimation of the three slurry samples are shown in Table 1.

TABLE 1

| sample | ammonium hydrogen phosphate (wt %) | pH | PETEOS removal rate (Å/min) |
|---|---|---|---|
| 1 | 0 | 4 | 1655 |
| 2 | 0.05 | 4 | 4602 |
| 3 | 0.1 | 4 | 4499 |

As can be seen from Table 1, when a small amount (about 0.05 wt %) of ammonium hydrogen phosphate, which is a phosphate compound, is added to the slurry composition, the oxide removal rate substantially increases.

<Second Test Samples>

Five slurry samples were fabricated to estimate the oxide and SiN removal rates and selectivity relative to the weight percentage of added poly-vinyl sulfonic acid, in a state where the amount of ammonium hydrogen phosphate is fixed at 0.25 wt %. Each sample wafer was a PETEOS blanket wafer or a silicon nitride blanket wafer. When the sample wafer was a PETEOS blanket wafer, PETEOS was deposited to a thickness of 10000 Å on a polysilicon substrate. When the sample wafer was a silicon nitride blanket wafer, high temperature oxide and silicon nitride are sequentially deposited to a thicknesses of 1000 Å and 2000 Å, respectively, on a polysilicon substrate. In the sample wafer, a ceria polishing solution of 1 wt % was used as a polishing agent. Polishing was performed in 6' PRESI equipment using an IC1400 stack pad and an R200 carrier film from the RODEL company, at a down pressure of 5 psi, a table speed of 65 rpm, a spindle speed of 35 rpm and a slurry flow rate of 250 ml/min. The results of estimation of the five slurry samples are shown in Table 2.

TABLE 2

| sample | ammonium hydrogen phosphate (wt %) | poly(vinyl sulfonic acid (wt %) | pH | PETEOS removal rate (Å/min) | SiN removal rate (Å/min) | selectivity |
|---|---|---|---|---|---|---|
| 1 | 0 | 0 | 4 | 1242 | 542 | 2.3:1 |
| 2 | 0.25 | 0 | 4 | 3610 | 1099 | 3.3:1 |
| 3 | 0.25 | 0.01 | 4 | 3626 | 1125 | 3.2:1 |
| 4 | 0.25 | 0.05 | 4 | 4017 | 1256 | 3.2:1 |
| 5 | 0.25 | 0.1 | 4 | 4676 | 1401 | 3.3:1 |

As can be seen from Table 2, when the weight percentage of poly-vinyl sulfonic acid is increased, the removal rates of both the oxide and the SiN also increase in a generally linear manner. As a result, there is no improvement in the selectivity.

<Third Test Samples>

Five slurry samples were fabricated to estimate the oxide and SiN removal rates and selectivity relative to the weight percentage of added potassium hydrogen phthalate, in a state where the amount of ammonium hydrogen phosphate is fixed at 0.2 wt %.

Each sample wafer was a PETEOS blanket wafer or a silicon nitride blanket wafer. When the sample wafer was a PETEOS blanket wafer, PETEOS was deposited to a thickness of 10000 Å on a polysilicon substrate. When the sample wafer was a silicon nitride blanket wafer, high temperature oxide and silicon nitride were sequentially deposited to thicknesses of 1000 Å and 2000 Å, respectively, on a polysilicon substrate. In the sample wafer, a ceria polishing solution of 1 wt % was used as a polishing agent. Polishing was performed in 6' PRESI equipment using an IC1400 stack pad and an R200 carrier film from the RODEL company, at a down pressure of 5 psi, a table speed of 65 rpm, a spindle speed of 35 rpm and a slurry flow rate of 250 ml/min. The results of estimation of the five slurry samples are shown in Table 3.

TABLE 3

| sample | ammonium hydrogen phosphate (wt %) | potassium hydrogen phthalate (wt %) | pH | PETEOS removal rate (Å/min) | SiN removal rate (Å/min) | selectivity |
|---|---|---|---|---|---|---|
| 1 | 0 | 0 | 4 | 1242 | 542 | 2.3:1 |
| 2 | 0.2 | 0 | 4 | 2668 | 1206 | 2.2:1 |
| 3 | 0.2 | 0.01 | 4 | 2615 | 1155 | 2.3:1 |
| 4 | 0.2 | 0.1 | 4 | 2688 | 899 | 3:1 |
| 5 | 0.2 | 0.25 | 4 | 2744 | 772 | 3.6:1 |

As can be seen from Table 3, when the weight percentage of potassium hydrogen phthalate is increased, the oxide removal rate increases somewhat, and the SiN removal rate decreases somewhat, resulting in an increase in selectivity. Nevertheless, the selectivity is still relatively low.

<Fourth Test Samples>

In this instance, five slurry samples were fabricated to estimate the oxide and SiN removal rates and selectivity relative to the weight percentage of added potassium hydrogen phthalate, which is a passivation agent, in a state where the weight percentage of ammonium hydrogen phosphate, which a removal rate accelerator, and poly-vinyl sulfonic acid, which is another passivation agent, are fixed at 0.05 wt %.

Each sample wafer was a PETEOS blanket wafer or a silicon nitride blanket wafer. When the sample wafer was a PETEOS blanket wafer, PETEOS was deposited to a thickness of 10000 Å on a polysilicon substrate. When the sample wafer was a silicon nitride blanket wafer, high temperature oxide and silicon nitride were sequentially deposited to thicknesses of 1000 Å and 2000 Å, respectively, on a polysilicon substrate. In the sample wafer, a ceria polishing solution of 1 wt % was used as a polishing agent. Polishing was performed in 6" PRESI equipment using an IC1400 stack pad and an R200 carrier film from the RODEL company, at a down pressure of 5 psi, a table speed of 65 rpm, a spindle speed of 35 rpm and a slurry flow rate of 250 ml/min. The results of estimation of the five slurry samples are shown in Table 4.

TABLE 4

| sample | ammonium hydrogen phosphate (wt %) | polyvinyl sulfonic acid (wt %) | potassium hydrogen phthalate (wt %) | pH | PETEOS removal rate (Å/min) | SiN removal rate (Å/min) | selectivity |
|---|---|---|---|---|---|---|---|
| 1 | 0.05 | 0.05 | 0 | 4 | 4556 | 1105 | 4.4:1 |
| 2 | 0.05 | 0.05 | 0.01 | 4 | 4557 | 1033 | 4.4:1 |
| 3 | 0.05 | 0.05 | 0.05 | 4 | 4465 | 59 | 76:1 |
| 4 | 0.05 | 0.05 | 0.1 | 4 | 4205 | 57 | 73:1 |
| 5 | 0.05 | 0.05 | 0.3 | 4 | 3582 | 63 | 57:1 |

As is readily apparent from Table 4, oxide to SiN selectivity is substantially increased by the addition of different first and second passivation agents (such as poly-vinyl sulfonic acid and potassium hydrogen phthalate) to the CMP slurry which also contains the removal rate accelerator. In fact, a selectivity of 50:1 or more can be achieved. This compares very favorably to conventional slurries which typically have a selectivity of around 4:1 or so.

<Fifth Test Samples>

In this case, three slurry samples were fabricated to estimate the oxide and SiN removal rates relative to different pH levels, in a state where the weight percentages of ammonium hydrogen phosphate, poly-vinyl sulfonic acid and potassium hydrogen phthalate, were fixed at 0.05 wt %.

Each sample wafer was a PETEOS blanket wafer or a silicon nitride blanket wafer. When the sample wafer was a PETEOS blanket wafer, PETEOS was deposited to a thickness of 10000 Å on a polysilicon substrate. When the sample wafer was a silicon nitride blanket wafer, high temperature oxide and silicon nitride were sequentially deposited to thicknesses of 1000 Å and 2000 Å, respectively, on a polysilicon substrate. In the sample wafer, a ceria polishing solution of 1 wt % was used as a polishing agent. Polishing was performed in 6" PRESI equipment using an IC1400 stack pad and an R200 carrier film from the RODEL company, at a down pressure of 5 psi, a table speed of 65 rpm, a spindle speed of 35 rpm and a slurry flow rate of 250 ml/min. The results of estimation of the three slurry samples are shown in Table 5.

TABLE 5

| sample | pH | PETEOS removal rate (Å/min) | SiN removal rate (Å/min) | PETEOS:SiN selectivity |
|---|---|---|---|---|
| 1 | 4 | 5111 | 69 | 74:1 |
| 2 | 8 | 3667 | 1113 | 3.3:1 |
| 3 | 10 | 3852 | 1036 | 3.7:1 |

As can be seen from Table 5, as the pH of slurry increases, the removal rate of PETEOS decreases, while the removal rate of the silicon nitride increases substantially. Consequently, the selectivity of the PETEOS with respect to SiN decreases substantially. Accordingly, in this particular embodiment, it has been determined that a slurry having a pH of 6 or less exhibits high selectivity. As such, selectivity can be especially enhanced by the use of first and second passivation agents, together with a pH controller which results in a pH of 6 or less.

Figure 8:
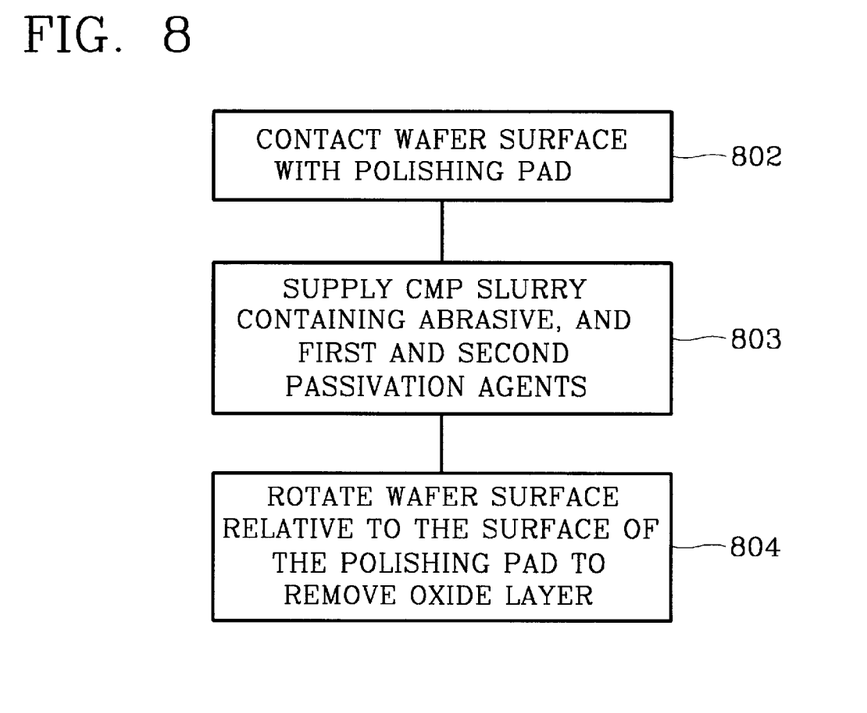
FIG. 8 is a process flow diagram of a CMP method of the present invention.

Turning now to the process flowchart of FIG. 8, a CMP process of the present invention will now be described. At step 802, a surface of a semiconductor wafer to be polished is made to contact the surface of a polishing pad. At step 804, an aqueous solution containing abrasive particles and different first and second passivation agents is supplied to an interface between the surface of the polishing pad and the surface of the semiconductor wafer. Then, at step 806, the surface of the semiconductor wafer is made to rotate relative to the surface of the polishing pad.

As mentioned previously, the first passivation agent may be poly-vinyl sulfonic acid, and the second passivation agent may be potassium hydrogen phthalate. Also, a removal rate accelerator and/or a pH controller may be added to the aqueous solution defining the CMP slurry.

Figure 9:
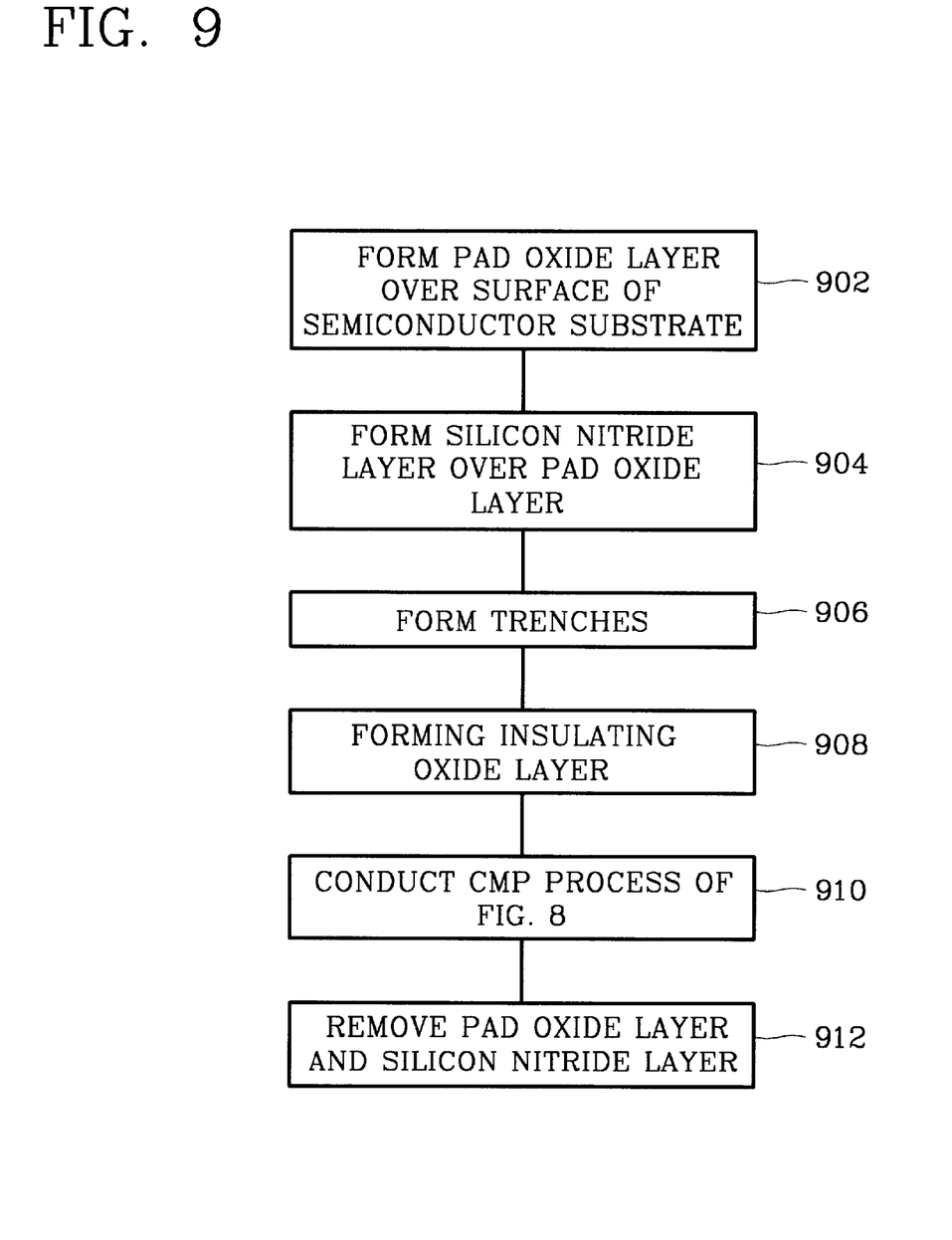
FIG. 9 is a process flow diagram of a shallow trench isolation method of the present invention.

FIG. 9 is a process flow diagram of a shallow trench isolation method of the present invention. At step 902, a pad oxide layer is formed over a surface of a semiconductor substrate. Then, at step 904, a silicon nitride layer is formed over the pad oxide layer such that the pad oxide layer is interposed between the semiconductor substrate and the silicon nitride layer. Next, at step 906, a plurality of trenches are formed which extend through the silicon nitride layer and the pad oxide layer and into the semiconductor substrate. At step 908, an insulating oxide layer is formed within the plurality of trenches and over the silicon nitride layer. Next, at step 910, the insulating oxide layer is removed down to a level of silicon nitride layer by being subjected to the chemical/mechanical polishing process described above in connection with FIG. 8. Again, the first passivation agent may be poly-vinyl sulfonic acid, and the second passivation agent may be potassium hydrogen phthalate. Also, a removal rate accelerator and/or a pH controller may be added to the aqueous solution defining the CMP slurry. Then, at step 912, the pad oxide layer and the silicon nitride layer are removed, resulting in a plurality of trench oxide regions in the surface of the semiconductor substrate.

While the present invention has been described with reference to the disclosed specific embodiments, it will be understood that modifications may be made without departing from the spirit of the invention. The scope of the invention is not intended to be limited by the description and examples set forth herein, but instead is to be defined by the appended claims.

What is claimed is:

1. The chemical/mechanical polishing slurry, comprising an aqueous solution which is suitable for use in removing an oxide material and which contains abrasive particles and different first and second passivation agents, wherein the first passivation agent is an anionic, cationic or nonionic surfactant, and wherein the aqueous solution further contains a removal rate accelerator.

2. The chemical/mechanical polishing slurry, comprising an aqueous solution containing abrasive particles and different first and second passivation agents, wherein the first passivation agent is poly-vinyl sulfonic acid.

3. The chemical/mechanical polishing slurry as recited in claims 1 or 2, wherein a weight percentage of the first passivation agent in the aqueous solution is 0.001–10 wt %.

4. The chemical/mechanical polishing slurry as recited in claims 1 or 2, wherein a weight percentage of the first passivation agent in the aqueous solution is 0.01–5 wt %.

5. The chemical/mechanical polishing slurry as recited in claim 2, wherein the second passivation agent is a phthalic acid and its salts.

6. The chemical/mechanical polishing slurry as recited in claim 2, wherein the second passivation agent is potassium hydrogen phthalate.

7. The chemical/mechanical polishing slurry as recited in claims 5 or 6, wherein a weight percentage of the second passivation agent in the aqueous solution is 0.001–1 wt %.

8. The chemical/mechanical polishing slurry as recited in claims 5 or 6, wherein a weight percentage of the second passivation agent in the aqueous solution is 0.02–0.5 wt %.

9. The chemical/mechanical polishing slurry as recited in claim 1, wherein the second passivation agent is a phthalic acid and its salts.

10. The chemical/mechanical polishing slurry as recited in claim 2, wherein the second passivation agent is potassium hydrogen phthalate.

11. The chemical/mechanical polishing slurry as recited in claim 9, wherein an amount of the first passivation agent in the aqueous solution is 0.001–10 wt %, and wherein an amount of the second passivation agent in the aqueous solution is 0.001–1 wt %.

12. The chemical/mechanical polishing slurry as recited in claims 10, wherein an amount of the first passivation agent in the aqueous solution is 0.001–10 wt %, and wherein an amount of the second passivation agent in the aqueous solution is 0.001–1 wt %.

13. The chemical/mechanical polishing slurry as recited in claims 9, wherein an amount of the first passivation agent in the aqueous solution is 0.01–5 wt %, and wherein an amount of the second passivation agent in the aqueous solution is 0.020–0.5 wt %.

14. The chemical/mechanical polishing slurry as recited in claim 10, wherein an amount of the first passivation agent in the aqueous solution is 0.01–5 wt %, and wherein an amount of the second passivation agent in the aqueous solution is 0.020–0.5 wt %.

15. The chemical/mechanical polishing slurry as recited in claim 1, wherein the anionic surfactant is selected from the group consisting of a carboxylic acid or its salt, a sulfuric ester or its salt, a sulfonic acid or its salt, and a phosphoric ester or its salt, wherein the cationic surfactant is selected from the group consisting of a primary amine or its salt, a secondary amine or its salt, a tertiary amine or its salt, and a quaternary amine or its salt, and wherein the nonionic surfactant is selected from the group consisting of a polyethyleneglycol type surfactant and a polyhydroxy alcohol type surfactant.

16. The chemical/mechanical polishing slurry as recited in any of claims 2 or 10, wherein the aqueous solution further contains a removal rate accelerator.

17. The chemical/mechanical polishing slurry as recited in claim 16, wherein the removal rate accelerator is ammonium hydrogen phosphate, and wherein a weight percentage of the ammonium hydrogen phosphate in the aqueous solution is 0.001–10 wt %.

18. The chemical/mechanical polishing slurry as recited in claim 16, wherein the removal rate accelerator is one selected from the group consisting of ammonium dihydrogen phosphate, potassium dihydrogen phosphate, bis(2-ethylhexyl)phosphate, 2-aminoethyl dihydrogenphosphaste, 4-chlorobenzenediazonium hexafluorophosphate, nitrobenzenediazonium hexafluorophosphate, ammonium hexafluorophosphate, bis(2,4 dichlorophenyl) chlorophosphate, bis(2-ethylhexyl)hydrogenphosphate, bis(2-ethylhexyl)phosphite, calcium fluorophosphate, diethyl chlorophosphate, diethyl chlorothiophosphate, potassium hexafluorophosphate, pyrophosphoric acid, tetrabutylammonium hexafluorophosphate, and tetraethylammonium hexafluorophosphate.

19. The chemical/mechanical polishing slurry as recited in any of claims 1, 2, 9 or 10, wherein the aqueous solution further contains a pH controller.

20. The chemical/mechanical polishing slurry as recited in claim 16, wherein the aqueous solution further contains a pH controller.

21. The chemical/mechanical polishing slurry as recited in claim 20, wherein the aqueous solution has a pH of between 2 and 6 inclusive.

22. The chemical/mechanical polishing slurry as recited in claim 2, wherein the abrasive particles are a metal oxide selected from the group consisting of ceria, silica, alumina, titania, zirconia and germania.

23. The chemical/mechanical polishing slurry as recited in claim 2, wherein a weight percentage of the abrasive particles in the aqueous solution is 0.1–25 wt %.

24. The chemical/mechanical polishing slurry as recited in claim 2, wherein an oxide to silicon nitride selectivity of the aqueous solution is at least 50:1.

25. The chemical/mechanical polishing slurry as recited in claim 10, wherein an oxide to silicon nitride selectivity of the aqueous solution is at least 50:1.

* * * * *